United States Patent

Hotta

[11] Patent Number: 6,114,013
[45] Date of Patent: Sep. 5, 2000

[54] SEALING LABEL FOR SEALING SEMICONDUCTOR ELEMENT

[75] Inventor: Yuji Hotta, Osaka, Japan

[73] Assignee: Nitto Denko Corporation, Osaka, Japan

[21] Appl. No.: 08/979,436

[22] Filed: Nov. 26, 1997

[30] Foreign Application Priority Data

Nov. 28, 1996 [JP] Japan ................................ 8-317235
Oct. 15, 1997 [JP] Japan ................................ 9-282311

[51] Int. Cl.$^7$ ........................................ B32B 23/02
[52] U.S. Cl. .................... 428/192; 428/458; 428/344; 257/668; 257/783; 257/784; 257/787; 257/788; 257/789
[58] Field of Search .................... 257/787, 788, 257/789, 790, 668, 783, 784; 428/192, 458, 344

[56] References Cited

U.S. PATENT DOCUMENTS

| | | | |
|---|---|---|---|
| 5,468,999 | 11/1995 | Lin et al. ............................. | 257/784 |
| 5,518,864 | 5/1996 | Oba et al. ............................ | 430/325 |
| 5,641,997 | 6/1997 | Ohta et al. ........................... | 257/788 |
| 5,670,826 | 9/1997 | Bessho et al. ....................... | 257/737 |
| 5,821,628 | 10/1998 | Hotta ................................... | 257/783 |
| 5,830,949 | 11/1998 | Mochizuki et al. ................. | 525/452 |
| 5,834,850 | 11/1998 | Hotta et al. .......................... | 257/788 |
| 5,892,289 | 4/1999 | Tokuno ................................ | 257/787 |
| 5,904,505 | 5/1999 | Hotta et al. .......................... | 438/124 |
| 6,001,951 | 12/1999 | Fukuoka et al. ..................... | 528/176 |
| 6,008,311 | 10/1998 | Sakamoto et al. .................. | 528/74 |

FOREIGN PATENT DOCUMENTS

| | | |
|---|---|---|
| 4-340258 | 11/1992 | Japan . |
| 5-343458 | 12/1993 | Japan ......................... H01L 21/56 |

*Primary Examiner*—Cathy F. Lam
*Attorney, Agent, or Firm*—Sughrue, Mion, Zinn, Macpeak & Seas, PLLC

[57] ABSTRACT

A sealing label for sealing semiconductor element comprises a metal foil substrate or a heat-resisting organic film substrate having formed thereon a sealing material component layer for sealing a semiconductor element, wherein the sealing material component layer is convexly formed such that the layer has a thick flat portion at the central portion of the substrate as compared with the peripheral portion of the substrate. The use of the sealing label in molding a semiconductor device can provide a semiconductor device having a high quality without substantially having voids in the sealing resin.

6 Claims, 3 Drawing Sheets

SEALING LABEL FOR SEALING SEMICONDUCTOR ELEMENT

FIELD OF THE INVENTION

The present invention relates to a sealing label for sealing semiconductor element.

BACKGROUND OF THE INVENTION

Hitherto, many resin-sealing type semiconductor devices have been resin-sealed by a transfer molding method. The transfer molding method comprises injecting a molten resin in a die cavity, in which a semiconductor element and a part of the lead frame are placed, by means of a transfer molding machine, to thereby resin-seal the semiconductor element and a part of the lead frame. The transfer molding method has been widely used for not less than ten years, the technique of the method has been established, and the transfer molding method can be said to be a stably mass-producible method about the semiconductor devices obtained by resin-sealing conventional general semiconductor elements.

However, recently, with the increase of the so-called environmental problem, the low utilization efficiency of the sealing resin in the transfer molding method is becoming a problem. In the transfer molding method, the utilization efficiency of the sealing resin is only from about 50 to 70%, the disadvantage of generating a large amount of a resin waste is pointed out, and thus the immediate improvement has been desired.

As a technique for solving such a problem, a method of forming a label-form or sheet-form sealing resin having a uniform thickness and sticking the sealing resin to a semiconductor element by heat-pressing is proposed. Also, it is proposed to improve the moisture-proof reliability and the strength of semiconductor devices by using a sealing label prepared by forming the sealing resin on a metal foil or a metal plate uniformly as described in JP-A-4-340258 (the term "JP-A" as used herein means an "unexamined published Japanese patent application").

By the above-described resin sealing method for semiconductor elements using a sealing resin formed into a label form or a sheet form, the utilization efficiency of the sealing resin becomes 100% in principle and the resin waste is not generated in the production process. However, in the case of using the method, there is a disadvantage that a void is liable to form in the resin after sealing and the point becomes the cause for delaying the practical use of the sealing method.

In addition, for solving the above-described problem, a die side is devised in such a manner that a die used at sticking the label-form or sheet-form sealing resin to a semiconductor element is divided into a frame-form die surrounding the circumstance of the sealing resin label or sheet and a press die setting in the inside of the frame-form die and an air-bent groove extending to the direction of crossing at right angle with the lead frame is formed on the inside surface of the frame-form die or the outside surface of the press die as described in JP-A-5-343458. However, in the method, not only it is necessary to use the complicated dies but also it cannot be said that the effect of preventing the formation of void is sufficient.

SUMMARY OF THE INVENTION

The present invention has been made under these circumstances and an object of the present invention is to provide a sealing label for sealing semiconductor element, which does not require a specific die and is hard to form void in the resin after sealing.

That is, the sealing label for sealing semiconductor element of the present invention comprises a metal foil substrate 1a or a heat-resisting organic film substrate 1b having formed thereon a sealing material component layer 2, 2' or 2" wherein the sealing material component layer is convexly formed such that the layer has a thick flat portion at the central portion of the substrate 1 (1a or 1b) as compared with the peripheral portion of the substrate 1 as shown in FIG. 1, FIG. 4 and FIG. 5 of the accompanying drawings as the schematic views showing the structure of each of the embodiments thereof respectively.

DETAILED DESCRIPTION OF THE INVENTION

Figure 1:
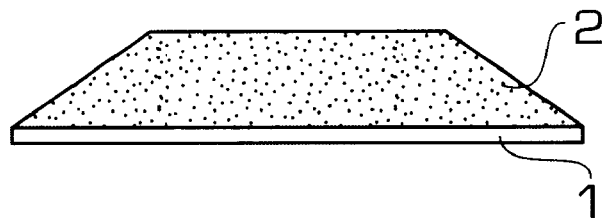
FIG. 1 is a schematic view showing the structure of an embodiment of the sealing label of the present invention.
Figure 4:
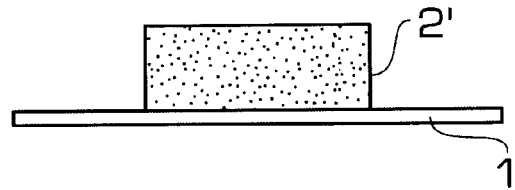
FIG. 4 is a schematic view showing the structure of other embodiment of the sealing label of the present invention.

Now, the term "the sealing material component layer 2 is convexly formed such that the layer 2 has a thick flat portion at the central portion of the substrate 1" include the state in which the thickness of the sealing material component layer 2 becomes gradually thinned from the central portion of the substrate 1 towards the peripheral portion of the substrate 1 as illustrated in FIG. 1, the state in which the sealing material component layer 2' is formed at the central portion only of the substrate as illustrated in FIG. 4, and the state in which the sealing material component layer 2 having a slope as in FIG. 1, where the thickness of the circumference becomes thinner in the outer side, is formed at the central portion only of the substrate 1.

In this case, it is preferred that the thickness of the thick flat portion of the sealing material component is from 0.3 to 1.0 mm.

If the thickness of the thick flat portion is thinner than 0.3 mm, a sufficient sealing material for completely sealing a semiconductor element cannot be supplied, and if the thickness thereof is thicker than 1.0 mm, the stress generated in the semiconductor device obtained after sealing becomes large, which are undesirable.

Also, the material for the metal foil substrate 1a used in the present invention can be arbitrarily selected but is preferably a metal such as Ni, Cu, and Al or an alloy such as a 42 alloy (42 nickel-iron alloy), a 45 alloy (45 nickel-iron alloy), and stainless steel.

Also, the thickness of a the metal foil substrate 1a is preferably from about 6 to 150 $\mu$m. In this case, if the thickness of the metal foil substrate is thinner than 6 $\mu$m, the rigidity of the sealing label becomes low and handling of the sealing label becomes difficult, while if the thickness is thicker than 150 μm, the thickness of the sealing material component layer is reduced relatively, thereby failing to ensure a sealing material component layer having a necessary amount for insulating sealing.

Furthermore, in the present invention, a heat-resisting organic film substrate 1b can be used as the substrate. As the organic film substrate, an organic film having a melting point of at least 200° C. can be preferably used. For example, polyimide, various kinds of modified polyimides, aromatic polyethers, naphthalene-series polyesters, and polysulfone, can be used. In these polymers, the organic films of the polymers having a melting point of at least 220° C. have a good soldering working stability after sealing and can be preferably used.

It is preferred that the organic film substrate has a thickness of from 25 to 150 μm, and the resulting sealing label can exhibit excellent stability at sealing working for the same reasons as in the case of the metal foil substrate.

On the other hand, as the material for the sealing material component layer 2, various kinds of thermosetting resins known in the field of the art can be used. Examples of the thermosetting resin include an epoxy resin, a polyimide resin, a maleimide resin, a silicone resin, and an acrylic resin. A polycarbodiimide resin is most preferable because of the low hygroscopic property.

Examples of the polycarbodiimide resin include one represented by following formula (1):

  (1)

wherein R represents a divalent organic group. n is preferably from 8 to 40.

Examples of the divalent organic group represented by R include:

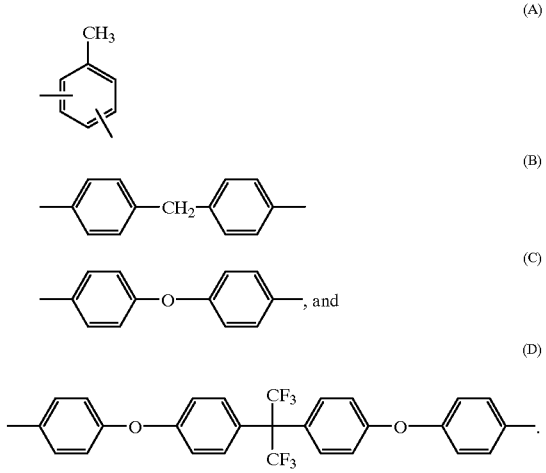

The polycarbodiimide resin can be prepared by a known method, but can be preferably prepared according to the method disclosed in Japanese Patent Application No. Hei. 8-159080.

Also, the sealing material component layer 2 may contain various known materials such as a curing agent and a curing catalyst for the resin used, a plasticizer, a filler, a flame retardant, and a low stress material.

The amount of the sealing material component layer 2 used in the present invention shall be smallest amount necessary for covering the wires of a semiconductor element for reducing the thermal stress generated between the layer and the substrate. Also, the sealing material component layer 2 is formed as a convex form having a flat portion on the substrate 1, whereby the portion of the sealing material component layer 2 corresponding to the central portion of a semiconductor element with which the layer 2 is brought into contact is thick. However, it is undesirable that the area of the convex portion having the flat portion is larger than the area of the semiconductor element with which the convex portion is to be brought into contact, since bubbles are liable to enter the semiconductor element near the bottom surface thereof.

Furthermore, in a semiconductor device wherein the electrodes on the semiconductor element are connected to outside conductor(s) by wire bonding, it is preferred to use the sealing material component layer 2 wherein the convex portion having the flat portion is formed such that the convex portion is brought into contact with the inner side of the semiconductor element than the electrode portions formed at the peripheral portion of the semiconductor element.

The sealing material component layer 2 can be formed on the surface of the metal foil substrate or the organic film substrate utilizing a so-called pattern printing means such as gravure printing and screen printing.

The present invention has been made as the result of making various investigations on the behavior of sealing resins in the softened state or the molten state and it has been confirmed that the desired object can be achieved by the construction of the present invention.

That is, when a lump of a fluid having a certain viscosity is pressed, the fluid is generally deformed while pushing away surrounding air to outside. According to the sealing label of the present invention wherein the sealing material component layer 2 is convexly formed on the metal foil substrate 1a or the organic film substrate 1b as described above, when the sealing label and a lead frame mounting thereon a semiconductor element are disposed in a pair of dies opposing each other and pressed by heating, the thickest portion of the convex sealing material component layer 2 is first brought into contact with the surface of the semiconductor element under a molding pressure, whereby the sealing material component layer is spread to the circumference while pushing away the surrounding gas to outside and molded in the inside surface of the dies. Thus, the air does not enter the inside of the resin, finally moves to the circumference of a pair of the dies and leaves the dies through the space between the opposing dies, whereby a void is hard to form in the sealing resin of the semiconductor device obtained.

In addition, the sealing label for semiconductor element of the present invention is a label form or sheet-form flat state as a whole and thus the label may be read as a sheet in the present invention.

Then, the embodiments of the sealing label for semiconductor element are described practically by referring to the accompanying drawings.

FIG. 1 is a schematic view showing the structure of an embodiment of the sealing label for semiconductor element of the present invention.

As shown in FIG. 1, a sealing material component layer 2 made up of a thermosetting resin such as a polycarbodiimide resin as the main component is formed on one surface of a substrate 1. The sealing material component layer 2 has a thick flat portion at the central portion of the substrate 1 and a slope at the peripheral portion of the substrate 1, the thickness of which becomes thinner towards the outside thereof. Namely, the sealing material component layer 2 has an almost square cone trapezoid convex form as a whole.

Figure 2:
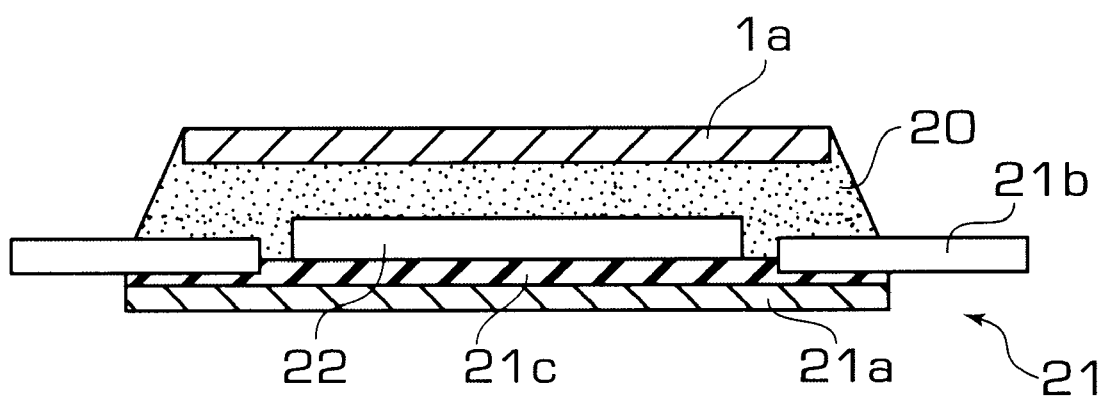
FIG. 2 is a schematic view showing an example of the structure of the semiconductor device formed using an embodiment of the sealing label of the present invention.
Figure 3A:
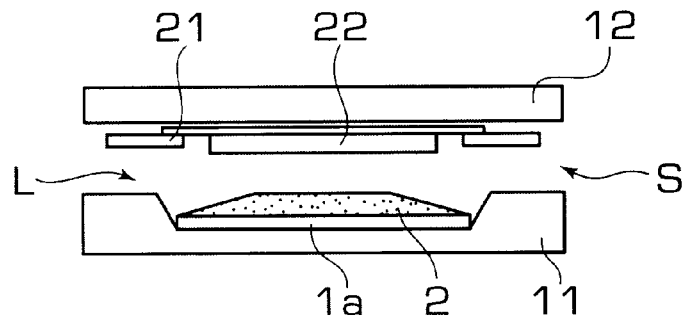
FIGS. 3(A) to 3(C) are view illustrative of an example of the resin-sealing process of a semiconductor device using an embodiment of the sealing label of the present invention.
Figure 3B:
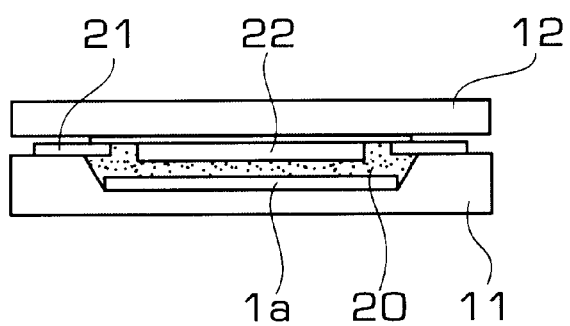
Figure 3C:
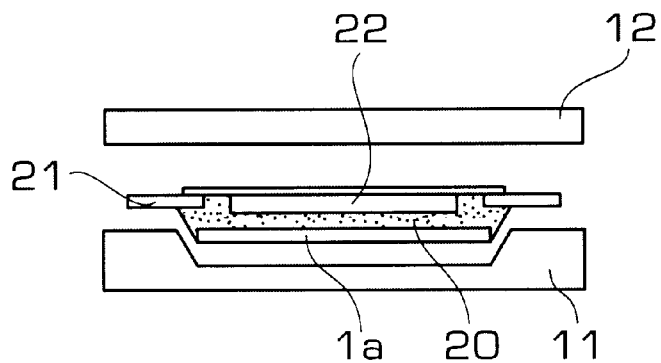

The sealing label as shown in the above-described embodiment of the present invention is used in the process as illustrated in FIGS. 3(A) to (C) as a sealing label for the one-surface mold-type QFP (Quad Flat Package) semiconductor device, etc., illustrated in FIG. 2 as the schematic cross-sectional view. That is, as shown in FIG. 3(A), the sealing label L using the metal foil substrate 1a as an embodiment of the present invention is disposed in a die 11 which is one of a pair of dies 11, 12 facing each other in the state the sealing material composition layer 2 faces the side of the other die 12. On the other hand, an assembly S of a two-layer lead frame 21 and a semiconductor element 22, the two-layer lead frame being formed by laminating a metal foil 21a and leads 21b via an adhesive layer 21c, is set onto the other die 12 in a state that the active surface side of the semiconductor element 22 faces the side of the die 11. In this case, the thickest region of the central portion of the sealing material component layer 2 almost faces the surface of the semiconductor element 22.

A semiconductor device having the structure shown in FIG. 2, in which the semiconductor element 22 and the inner lead portions of the two-layer lead frame 21 are sealed with the sealing resin 20 made up of the components constituting the sealing material component layer 2, and both the front surface and the back surface of the sealing resin 20 are covered with the metal foil 21a and the metal foil substrate 1a, can be obtained by, while heating the sealing label to soften or molten the sealing material component in the sealing material component layer 2, closing the dies as shown in FIG. 3(B) to thereby mold the sealing material component (partly cured or cured), and then opening the dies as shown in FIG. 3(C).

In the above process, because the sealing material component layer 2 of the sealing label L is convexly formed on the metal foil substrate 1a, at closing the dies, the thickest portion of the central portion of the layer 2 is first brought into contact with the surface of the semiconductor element 22, whereby the sealing material component in a softened or molten state penetrates into the opening portions surrounding the semiconductor element 22 while being spread to the circumference. In this case, since the softened or molten sealing material component is molded while pushing away the surrounding gas, the gas leaves from the dies through the space between the dies 11 and 12 without entering the inside of the sealing material component. Thus, the semiconductor device obtained has a good quality without existing void in the sealing resin 20.

Figure 5:
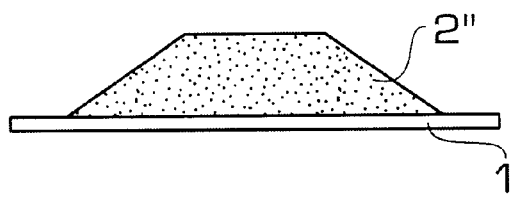
FIG. 5 is a schematic view showing still other embodiment of the sealing label of the present invention.

FIG. 4 and FIG. 5 each is a schematic view showing the structure of other embodiment of the sealing label of the present invention.

The embodiment of FIG. 4 is one where a sealing material component layer 2' having a definite thickness is laminated on the central portion only of one surface of a substrate 1 which is the same as that of the above-described embodiment, and the embodiment of FIG. 5 is one where a sealing composition component layer 2" of an almost square cone trapezoid form, where the peripheral portion is formed by a slope as the embodiment shown in FIG. 1, is formed on the central portion only of one surface of a substrate 1. It has been confirmed that by these structures shown in FIG. 4 and FIG. 5, semiconductor devices having the sealing resin without having void can be obtained according to the same process as shown in FIGS. 3(A) to 3(C).

The sealing label for sealing semiconductor element of the present invention can be used for producing any other semiconductor devices besides the one-surface mold-type QFP semiconductor device shown in FIG. 2. With respect to the sealing process utilizing the sealing label and the form of the die, other processes and dies than those illustrated in FIGS. 3(A) to 3(C) can be used.

Furthermore, as the sealing label for sealing semiconductor element of the present invention, the sealing label having the structure shown in FIG. 1, etc., as the schematic view may be singly handled. Alternatively, it is possible to employ a modification where the plural sealing labels are handled such that they are connected to each other at the metal foil substrates or the heat-resisting organic film substrates, and the connected portion is separated directly before the sealing process.

Then, examples of practically producing semiconductor devices using each of the sealing labels of the present invention shown above as the embodiments thereof are described together with a comparative example.

EXAMPLE 1

Using the sealing label L composed of the metal foil substrate 1a having the structure shown in FIG. 1, the QFP semiconductor device of 0.6 mm in thickness and 20 mm square having the structure shown in FIG. 2 was molded using the process shown in FIGS. 3(A) to 3(C). In this case, the area of the semiconductor element was 8 mm×8 mm and the flat portion of the sealing material component layer 2 was 7 mm×7 mm.

For the sealing label L, the material of the sealing material component layer 2 was a polycarbodiimide resin and the metal foil substrate 1a was made up of a copper foil having a thickness of 35 $\mu$m. Also, the thickest thickness of the sealing material component layer 2 was 400 $\mu$m, a slope was formed on the surroundings over 2 mm on the top view, and the thickness at the peripheral portion of the metal foil substrate 1a was 0.

EXAMPLE 2

Using a sealing label prepared by forming a sealing material component layer made up of a polycarbodiimide resin on a polyimide film (Kapton, trade name) substrate 1b having a thickness of 50 $\mu$m as in Example 1, the QFP semiconductor device of 0.6 mm in thickness and 20 mm square having the structure shown in FIG. 2 was molded using the process shown in FIGS. 3(A) to 3(C). In addition, the area of the semiconductor element and the area of the flat portion of the sealing material component layer 2 were the same as those in Example 1.

COMPARATIVE EXAMPLE

Figure 6:
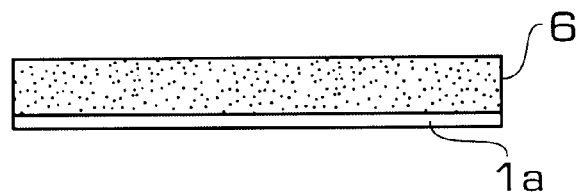
FIG. 6 is a schematic view showing the structure of the sealing label used in the comparative example.

A semiconductor device as in the above examples was molded using the process shown in FIGS. 3(A) to 3(C) as in the above examples. However, in this case, as the sealing label, a sealing label prepared by laminating a sealing material component layer 6 having a uniform thickness to the one surface of a metal foil substrate 1a was used as shown in FIG. 6 as the schematic view. The amount of the sealing material component forming the sealing material component layer 6 was the same as those in the examples.
Evaluation of Examples and Comparative Example About each of the semiconductor devices molded in the examples and the comparative example described above, the size and the number of voids in the inside of the sealing resin were determined using an X-ray transmission apparatus.

The obtained results are as follows.

That is, in the semiconductor devices obtained in Example 1 and Example 2, voids having a diameter of 5 $\mu$m or larger were not detected, while in the semiconductor device obtained in the comparative example, two large voids having a diameter of exceeding 100 $\mu$m and not less than ten voids having a diameter of from 5 to 100 $\mu$m were detected.

As described above, in the sealing process of a semiconductor device using the sealing label according to the present invention, the sealing material component layer, which is convexly formed on a metal foil substrate or a heat-resisting organic film substrate, is molded in such a manner that the thickest portion of the central portion of the layer is pressed and the material component constituting the layer flows pushing away a surrounding gas to outside, whereby a gas leaves efficiently from the circumference of the die. Without need of a die modified specially, there is a very less possibility that the gas enters the inside of the sealing resin. The thus-obtained semiconductor device has a high quality without substantially having voids in the sealing resin.

While the invention has been described in detail and with reference to specific embodiments thereof, it will be apparent to one skilled in the art that various changes and modifications can be made therein without departing from the spirit and scope thereof.

What is claimed is:

1. A sealing label for sealing a semiconductor elements comprising a metal foil substrate or a heat-resisting organic film substrate, the substrate having formed thereon a sealing material component layer for sealing a semiconductor element, wherein the sealing material component layer is convexly formed such that the layer has a thick flat portion at a central portion of the substrate as compared with a peripheral portion of the substrate.

2. The sealing label of claim 1, wherein the flat portion of the sealing material component layer has a thickness from 0.3 to 1.0 mm and the flat portion has an area equivalent to or smaller than an area of a semiconductor element which is to be brought into contact with the sealing label and then sealed with the sealing label.

3. The sealing label of claim 1, wherein the sealing material component layer contains a polycarbodiimide resin as a main component.

4. The sealing label of claim 2, wherein the sealing material component layer contains a polycarbodiimide resin as a main component.

5. The sealing label of claim 3, wherein the polycarbodiimide resin is represented by formula (1):

(1)

wherein n is from 8 to 40, and R represents a divalent organic group.

6. The sealing label of claim 4, wherein the polycarbodiimide resin is represented by formula (1):

(1)

wherein n is from 8 to 40, and R represents a divalent organic group.

* * * * *